United States Patent
Frohlich et al.

(10) Patent No.: US 9,329,101 B2
(45) Date of Patent: May 3, 2016

(54) END-POSITION-MONITORING OF A GAS INJECTOR

(71) Applicant: GE Jenbacher GmbH & Co OG, Jenbach (AT)

(72) Inventors: Moritz Frohlich, Innsbruck-Igls (DE); Markus Kraus, Wiesing (AT); Markus Kroll, Ginzling (AT)

(73) Assignee: GE JENBACHER GMBH & CO OHG, Jenbach (AT)

( * ) Notice: Subject to any disclaimer, the term of this patent is extended or adjusted under 35 U.S.C. 154(b) by 349 days.

(21) Appl. No.: 14/097,521

(22) Filed: Dec. 5, 2013

(65) Prior Publication Data

US 2014/0095052 A1     Apr. 3, 2014

Related U.S. Application Data

(63) Continuation of application No. PCT/AT2012/000152, filed on May 31, 2012.

(30) Foreign Application Priority Data

Jun. 7, 2011 (AT) ...................................... 841/2011

(51) Int. Cl.
*G01M 15/04* (2006.01)
*F02D 41/20* (2006.01)
*F02D 41/22* (2006.01)
(Continued)

(52) U.S. Cl.
CPC ............. *G01M 15/04* (2013.01); *F02D 19/025* (2013.01); *F02D 19/027* (2013.01); *F02D 41/20* (2013.01); *F02D 41/221* (2013.01); *F02M 21/0254* (2013.01); *F02M 21/0293* (2013.01); *F02D 2041/2055* (2013.01);
(Continued)

(58) Field of Classification Search
CPC ...... G01M 15/04; F02D 41/20; F02D 41/221; F02D 19/025; F02D 19/027; F02D 2041/224; F02M 21/0293; Y02T 10/32; Y02T 10/40
See application file for complete search history.

(56) References Cited

U.S. PATENT DOCUMENTS 3,202,839 A     8/1965   Allmark
5,947,090 A *   9/1999   Maeda .................... F02D 41/20
                                                                  123/490

(Continued)

FOREIGN PATENT DOCUMENTS

CN     101988452      3/2011
DE     102 15 906     10/2003
(Continued)

OTHER PUBLICATIONS

Chinese Office Action (OA) and Search Report (SR) issued May 6, 2015 in family member Chinese Patent Application No. 201280023105.8.
(Continued)

*Primary Examiner* — Hieu T Vo
(74) *Attorney, Agent, or Firm* — Wenderoth, Lind & Ponack, L.L.P.

(57) ABSTRACT

A method includes checking whether an electromagnetically actuated gas injector arranged in an internal combustion engine between a fuel source and a combustion chamber is in the closed end position thereof. According to the method, an electric test voltage is applied to the gas injector and the discharge current generated by the electric test voltage is measured.

11 Claims, 4 Drawing Sheets

(51) Int. Cl.
*F02M 21/02* (2006.01)
*F02D 19/02* (2006.01)
*G01R 31/28* (2006.01)

(52) U.S. Cl.
CPC .. *F02D 2041/2058* (2013.01); *F02D 2041/224* (2013.01); *G01R 31/2829* (2013.01); *Y02T 10/32* (2013.01); *Y02T 10/40* (2013.01)

(56) References Cited

U.S. PATENT DOCUMENTS 6,571,774 B2 * 6/2003 Yomogida ............. F02D 41/062
　　　　　　　　　　　　　　　　　　　　　　123/456
2006/0186230 A1 * 8/2006 Adams ............... F02M 21/0269
　　　　　　　　　　　　　　　　　　　　　　239/585.1
2011/0023836 A1 2/2011 Verner et al.

FOREIGN PATENT DOCUMENTS

DE　　　　103 35 152　　　3/2005
DE　　10 2008 029 224　　12/2009
GB　　　　2 377 025　　　12/2002

OTHER PUBLICATIONS

International Search Report issued in International Application No. PCT/AT2012/000152 on Nov. 26, 2012.

* cited by examiner

END-POSITION-MONITORING OF A GAS INJECTOR

BACKGROUND OF THE INVENTION

The present invention concerns a method of checking the existence of a correct end position of an electromagnetically actuated gas injector arranged in an internal combustion engine between a fuel source and a combustion chamber.

The invention further concerns an internal combustion engine having an engine control, a source for gaseous fuel, at least one combustion chamber in which the gaseous fuel is ignited, and an electromagnetically actuated gas injector arranged between the source for the gaseous fuel and the at least one combustion chamber.

Electromagnetically actuated gas injectors are movable from a closed end position in which they interrupt the connection between the fuel source and the combustion chamber into an opened end position by the application of a suitable electric opening voltage and the opening current flowing as a result. The return movement of the gas injectors into the closed end position is preferably effected mechanically by a spring in the injector.

If the gas injector is not completely closed due to a defect or because of a foreign body gaseous fuel (hereinafter referred to for brevity as 'gas') can flow through the gas injector at an unwanted moment in time and/or in an unwanted amount. An ignitable mixture can be formed at a moment in time which is not intended for that, from the gas flowing into the combustion chamber and mixing there with air. In addition this can involve a lower lambda value of the mixture in the combustion chamber than is wanted (excessively rich mixture) as more gas flows into the combustion chamber than is wanted. In both cases damage to the internal combustion engine can occur due to unwanted or uncontrolled combustion.

Various methods are already known, which detect whether the gas injector is in its opened end position. If the gas injector is in its opened end position at the checking time, although it should be planned to be closed at that time, it is possible in that situation to conclude that there is a defective gas injector.

A disadvantage with such methods is that at least one combustion cycle takes place between the occurrence of the defective injector position and detection of that condition.

SUMMARY OF THE INVENTION

The object of the invention is to provide an improved method of detecting an unwanted open condition of the gas injector.

That object is attained by a method having the features of claim 1 and an internal combustion engine having the features of claim 11. Further advantageous embodiments of the invention are defined in the appendant claims.

The invention therefore, in contrast to the state of the art, does not provide for checking the opened end position but checking the closed end position of the gas injector.

Checking the occurrence of the closed end position involves applying to the gas injector an electric test voltage which results in a test current. Measurement of the discharge current which occurs is effected after the test voltage is switched off.

That is effected at any moment in time at which the gas injector should be closed, but preferably in the period of time between the predetermined injector closing time and the planned ignition time.

In the case of electromagnetically actuated gas injectors, there is provided an iron core mounted movably in a magnetic coil for opening and closing the gas injector. The inductance of the magnetic coil is changed by the movement of the iron core and the resulting change in the air gap in the magnetic circuit when the gas injector opens and closes. That causes the configuration of the discharge current generated by the electric test voltage to change. The invention therefore, provides that the inductance of the magnetic coil depends on the position of the iron core in the coil, wherein the iron core projects correspondingly further from the coil, the further the gas injector is away from its closed end position.

The test current which is acted upon by the electric test voltage can preferably be so selected that the electric energy supplied is not sufficient for lifting off the gas injector from the valve seat. Checking is therefore possible at a moment at which the gas injector according to plan was intended to be in its closed end position due to the mechanical spring force (and was also intended to remain there). That has the advantage that it is possible to conclude directly that there is a defective injector position, more specifically even before a planned ignition takes place in the combustion chamber. It is therefore already possible to react to an incorrect injector position prior to ignition of the mixture in the combustion chamber and the ignition spark can be suppressed so that no uncontrolled combustion occurs.

Various mathematical techniques (which are known to all the men skilled in the art) can be applied in the engine control of the internal combustion engine to the measured configuration of the discharge current to obtain a measurement value for the injector position, for example:
- determining the increase in the discharge current,
- measuring the absolute current value at a given moment in time,
- ascertaining the integral of the curve of the discharge current, and
- calculating the inductance or the impedance from the current configuration in respect of time in accordance with the relationship $I(t)=I_{max}*\exp(-R*t/L)$.

Those mathematical techniques can be applied to the range with a rising charging current and/or to the range with a falling discharge current.

The invention also makes it possible to distinguish between defective and worn gas injectors, more specifically by the application of the electric test voltage being implemented at least twice, which makes it possible to determine the moment in time of the attainment of the closed end position of the gas injector and/or the time required until that position is reached.

Wear of the gas injectors used is characterized by a shift in the moment in time at which the closed end position is reached. The time configuration of the closing operation can be established by a first measurement immediately after the closing time of a brand-new solenoid valve and any number of but at least one further measurement (delayed after defined periods of time relative to the first measurement). The actual closing time can be ascertained on the basis of those measurements. The quantitative gas flow through the injector can be ascertained by that closing time and that flow can be incorporated into the regulation procedure or damage to the internal combustion engine can be prevented if the amount of gas is too great.

The advantage of repeated measurement therefore entails ascertaining the moment in time at which the closed end position is reached (in contrast to detecting that the closed end position was reached at all, in the case of one-off measurement). It is possible in that way to more precisely ascertain a dangerous condition and to operate the internal combustion engine for longer with worn valves so that the availability of the internal combustion engines can be increased.

The invention is particularly preferably provided in the case of those internal combustion engines which are in the form of stationary Otto-cycle gas engines, in particular for power generation.

BRIEF DESCRIPTION OF THE DRAWINGS

Further advantages and details of the invention will be apparent from the Figures and the description relating thereto. In the Figures.

DETAILED DESCRIPTION OF THE INVENTION

Figure 1:
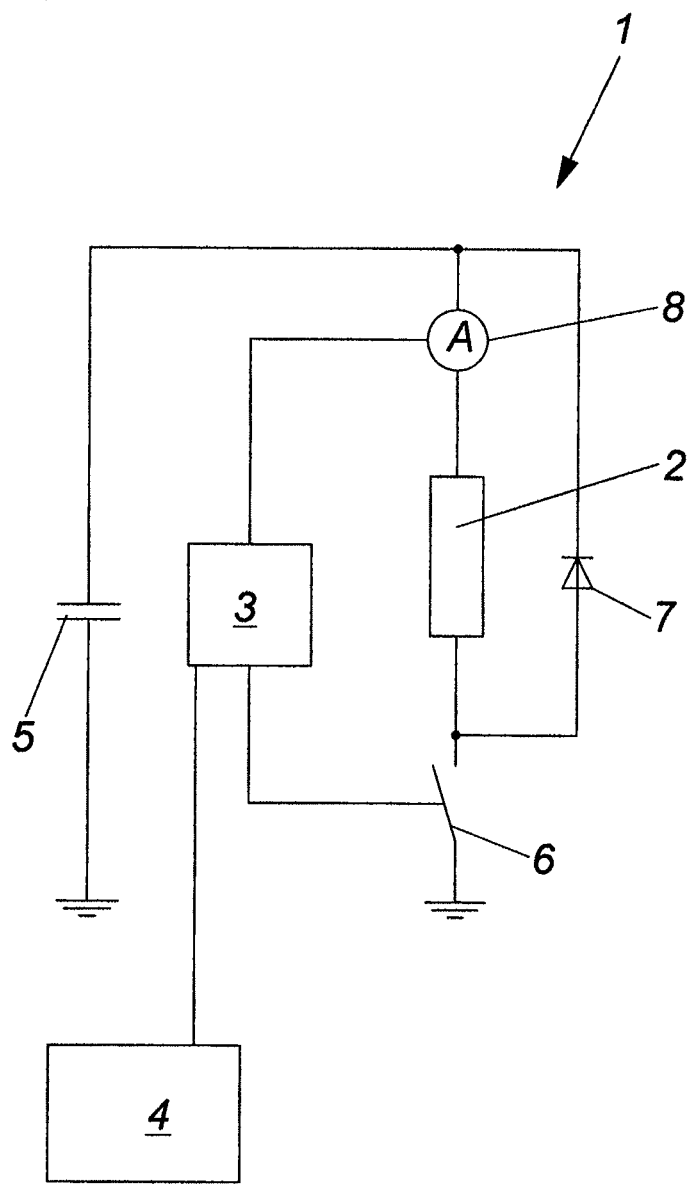
FIG. 1 diagrammatically shows the structure of an electromagnetically actuated gas injector.

FIG. 1 diagrammatically shows the electric equivalent circuit diagram of an electromagnetically actuated gas injector valve 1. The arrangement of coil, iron core and injector valve head connected thereto is generally identified by reference 2 and completely corresponds to the state of the art. Reference 5 denotes a capacitor for voltage supply. The application of an electric voltage is preferably required only for opening the gas injector 1. Closing can be effected by a mechanical force storage means (spring).

A controller 3 of the gas injector 1 is connected to an engine control 4 of the internal combustion engine, which is so designed that, at least a moment in time at which the gas injector should be in a closed end position, it applies an electric test voltage to the gas injector 1 by the controller 3 by way of the switch 6, measures the discharge current I caused by the electric test voltage, and thus draws a conclusion about the existence of the closed end position of the gas injector 1. Provided for measuring the discharge current I passing by way of the freewheeling diode 7 is an ammeter 8, the signals of which can be fed to the controller 3.

Figure 2:
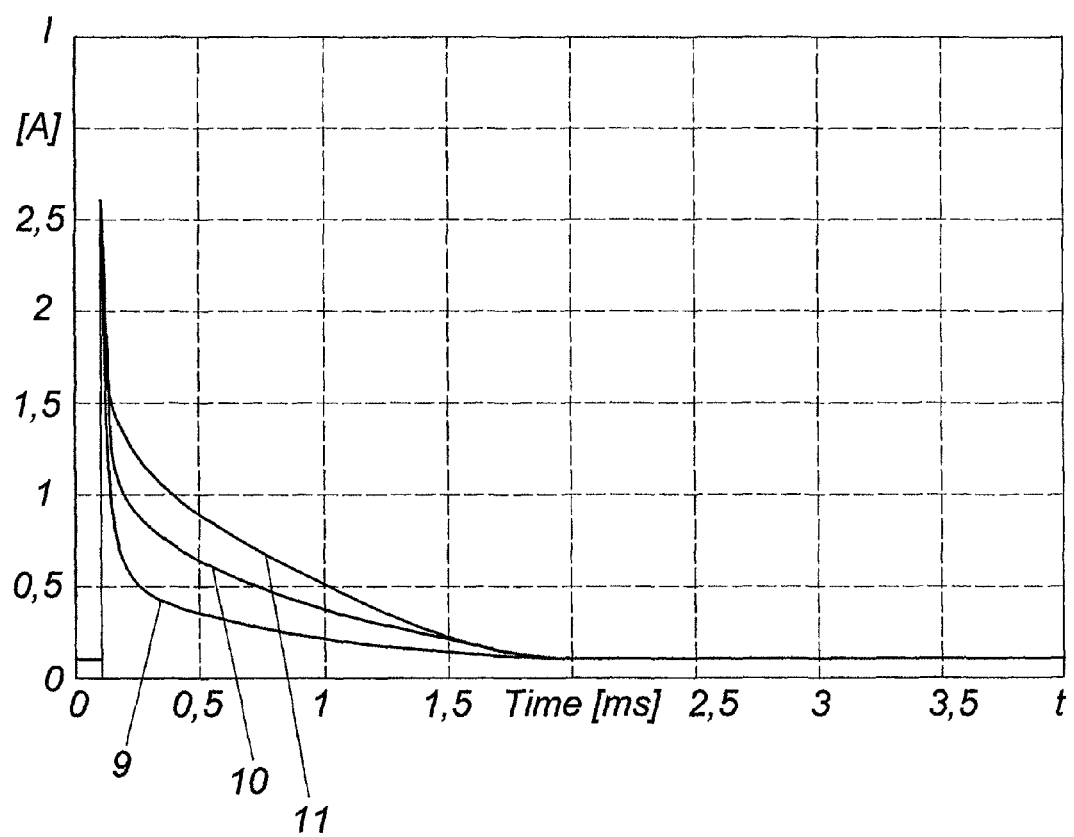
FIG. 2 shows configurations of the discharge current in relation to time for different injector positions.

FIG. 2 represents the discharge current I (in amps) measured as a reaction to an applied test voltage, plotted against time t (in milliseconds).

The curve 9 represents the measurement result for the situation where the gas injector 1 was completely opened during the measurement (100% displacement travel of the iron core).

The curve 11 represents the measurement result for the situation where the gas injector 1 was completely closed during the measurement (0% displacement travel of the iron core).

The curve 10 represents the measurement result for the situation where the gas injector 1 was approximately half-opened during the measurement (60% displacement travel of the iron core).

Figure 3:
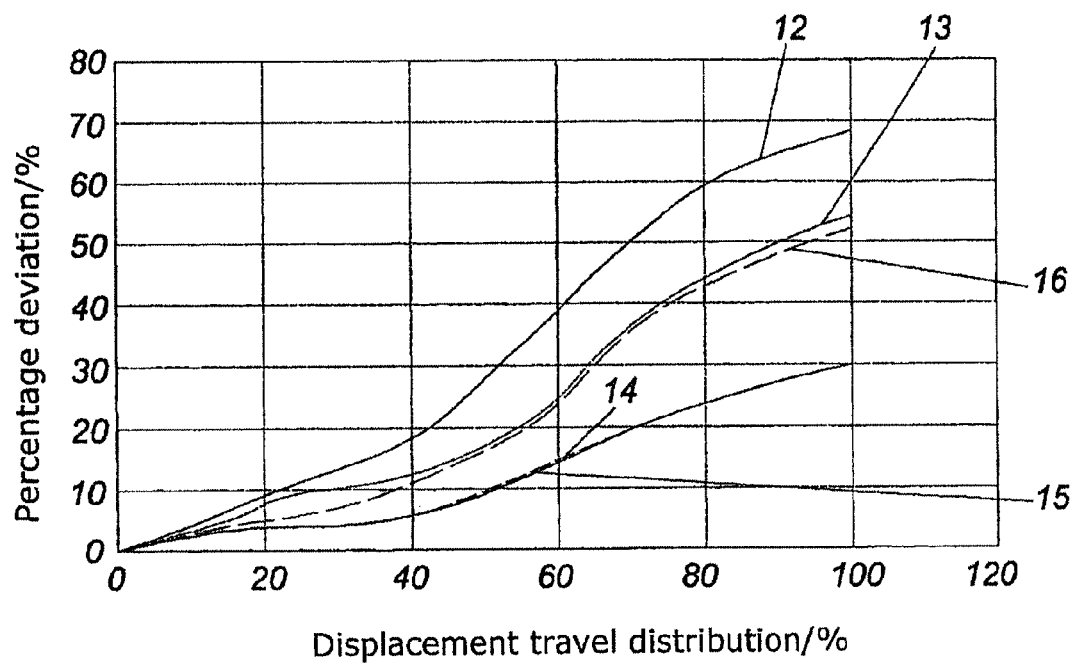
FIG. 3 shows results of various evaluation methods.

FIG. 3 shows a comparison of the results of various evaluation methods.

The percentage deviation from the measurement value of a completely closed injector valve is shown on the y-axis (point of intersection of the two axes). Shown in percent on the x-axis is the displacement travel of the iron core, wherein 0% corresponds to a completely closed injector valve and 100% corresponds to a completely opened injector valve.

The curve 12 shows the result of an increase calculation based on the increase in the discharge current I.

The curve 13 shows the result of a calculation on the basis of the maximum amplitude of the discharge current I at a fixed moment in time in the course of the discharge current.

The curve 14 shows the result of a calculation based on integration of the area beneath the curve in respect of the discharge current I in FIG. 2 over the entire discharge duration.

The curve 15 shows the result of inductance calculation from the current variation in respect of time in accordance with the relationship $I(t)=I_{max}*\exp(-R*t/L)$.

The curve 16 shows the result of a calculation based on integration of the area beneath the curve in respect of the discharge current I in FIG. 2 over a defined time sub-region of the entire discharge duration.

The position of the injector valve (closed, opened or partially opened) can be clearly detected from all methods based on the evaluation of the discharge current configuration in respect of time, with the quality of detection differing. The curve 12 shows the best detectability, curves 14 and 15 show the worst detectability which however is still sufficient.

Figure 4:
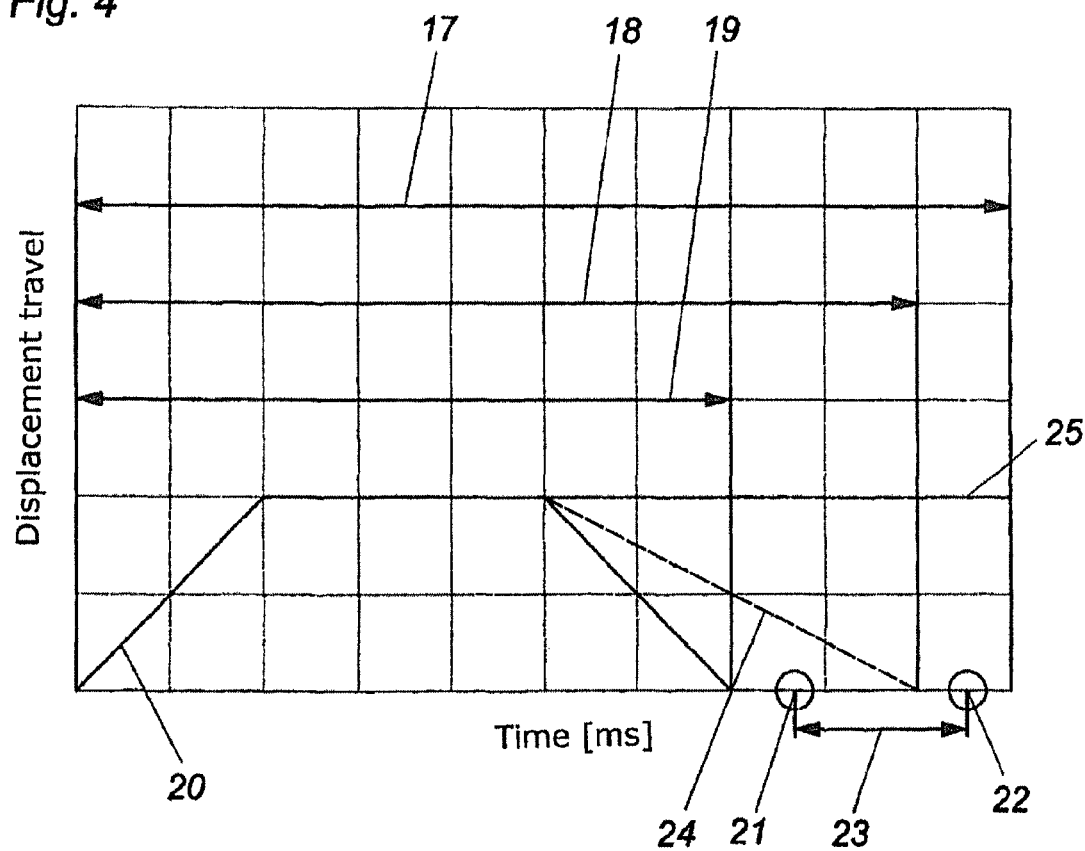
FIG. 4 shows a view of the detection of different closing times of the gas injector.

FIG. 4 relates to the possibility of being able to distinguish between a defective gas injector 1 and a gas injector 1 which is only worn, by at least twice applying the method according to the invention. FIG. 4 shows the displacement travel of the iron core on the y-axis. The time t is plotted in milliseconds on the x-axis.

The period of time 17 shows the opening duration of a defective gas injector 1, which per se is infinite (limited here by the time duration of the measurement operation) as in fact it never reaches the closed end position.

The period of time 19 shows the opening duration of a brand-new properly functioning gas injector 1.

The period of time 18 shows the opening duration of a worn gas injector 1.

The curve 20 shows the displacement travel of a brand-new gas injector 1.

The curve 25 shows the displacement travel of a gas injector 1 with a defect which has occurred after opening.

The curve 24 shows the displacement travel of a worn gas injector 1.

References 21 and 22 denote the moments in time of first and second detection according to the invention. The period of time 23 is the predetermined wear tolerance and here is 0.5 ms.

At the moment in time 22 of the second detection operation a worn valve is closed but a defective valve is still opened. Thus, in the case of a worn valve, the opening duration can be adjusted to the required amount of gas by the engine control 4 and the internal combustion engine can be further operated with the new settings. In the case of a defective injector valve however ignition is deactivated and the internal combustion engine is shut down to prevent damage due to the excessively increased amount of gas.

The invention claimed is:

1. An internal combustion engine comprising: an engine control, a source for gaseous fuel, at least one combustion chamber in which the gaseous fuel is ignited, and an electromagnetically actuated gas injector arranged between the source for the gaseous fuel and the at least one combustion chamber, wherein at least one moment in time at which the gas injector should be in a closed end position the engine control applies an electric test voltage to the gas injector, measures the discharge current caused by the electric test voltage and thus draws a conclusion about the existence of the closed end position of the gas injector.

2. A method comprising checking whether an electromagnetically actuated gas injector arranged in an internal combustion engine between a fuel source and a combustion chamber is in its closed end position, including applying an electric test voltage to the gas injector and measuring the discharge current caused by the electric test voltage.

3. A method as set forth in claim 2 wherein the electric test voltage is applied in the period of time between a predetermined injector valve closing time and a planned ignition time.

4. A method as set forth in claim 2 wherein the electric test voltage is applied in the form of a dc voltage pulse with a predetermined time duration and/or of predetermined amplitude.

5. A method as set forth in claim 2 wherein the electric test voltage is applied in the form of an ac voltage with a predetermined time duration and/or of predetermined amplitude.

6. A method as set forth in claim 2 wherein the increase in the discharge current (I) is determined in a predetermined time interval.

7. A method as set forth in claim 2 wherein the absolute value of the discharge current (I) is determined at least one moment in time.

8. A method as set forth in claim 2 wherein an integral of the discharge current (I) is determined over a predetermined time interval.

9. A method as set forth in claim 2 wherein the inductance or the impedance of the injector valve coil is determined from the discharge current.

10. A method as set forth in claim 2 wherein the application of the electric test voltage is performed at least twice to determine the moment in time of the attainment of the closed end position of the gas injector (1) and/or the time required to reach the closed end position thereof.

11. A method as set forth in claim 10 wherein a distinction is drawn between a worn and a defective gas injector by a control of the internal combustion engine depending on the determined moment in time or the required time, and wherein in the case of a worn gas injector, the opening duration of the gas injector is adjusted by the control to the required amount of gas, and in the case of a defective gas injector, the ignition of the combustion engine is deactivated by the control.

\* \* \* \* \*